US009722335B2

(12) United States Patent
Berry, Jr. et al.

(10) Patent No.: US 9,722,335 B2
(45) Date of Patent: Aug. 1, 2017

(54) DUAL IN LINE MEMORY MODULE (DIMM) CONNECTOR

(71) Applicant: QUALCOMM Incorporated, San Diego, CA (US)

(72) Inventors: Robert Walter Berry, Jr., Round Rock, TX (US); Ryan Joseph Pennington, Austin, TX (US); Joab Daniel Henderson, Pflugerville, TX (US); Divya Kumar, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 169 days.

(21) Appl. No.: 14/270,156

(22) Filed: May 5, 2014

(65) Prior Publication Data

US 2015/0318627 A1 Nov. 5, 2015

(51) Int. Cl.
| | |
|---|---|
| *G06F 11/07* | (2006.01) |
| *H01R 12/70* | (2011.01) |
| *G06F 11/20* | (2006.01) |
| *G06F 13/16* | (2006.01) |
| *G06F 13/40* | (2006.01) |

(52) U.S. Cl.
CPC ......... *H01R 12/7076* (2013.01); *G06F 11/07* (2013.01); *G06F 11/2094* (2013.01); *G06F 13/1668* (2013.01); *G06F 13/409* (2013.01)

(58) Field of Classification Search
USPC ...................................................... 714/6.11
See application file for complete search history.

(56) References Cited

U.S. PATENT DOCUMENTS

| | | | |
|---|---|---|---|
| 6,108,730 A | 8/2000 | Dell et al. | |
| 6,203,338 B1 * | 3/2001 | Choy | H01R 12/721 439/83 |
| 7,156,701 B1 * | 1/2007 | Pennypacker | H01R 12/52 439/637 |
| 7,351,072 B2 | 4/2008 | Muff et al. | |
| 7,477,522 B2 | 1/2009 | Hazelzet | |
| 7,711,887 B1 * | 5/2010 | Warnes | G06F 13/1694 710/310 |
| 7,717,752 B2 | 5/2010 | Loughner et al. | |
| 7,818,626 B1 * | 10/2010 | Tsien | G06F 11/366 714/25 |

(Continued)

OTHER PUBLICATIONS

International Search Report and Written Opinion—PCT/US2015/025772—ISA/EPO—Jul. 21, 2015.

*Primary Examiner* — Kamini Patel
(74) *Attorney, Agent, or Firm* — Qualcomm Incorporated/Seyfarth (57) ABSTRACT

An enhanced dual in line memory module (DIMM) connector includes internal conductive paths that provide access to signaling on standard conductive paths to an industry standard DIMM. The internal conductive paths are coupled in series or in parallel with the standard conductive paths through the connector. Interposer circuitry, such as control circuitry and or supplemental memory circuitry, may be incorporated on or within the connector. The interposer circuitry may include field effect transistor (FET) switching circuitry configured to selectively decouple a defective dynamic random memory (DRAM) on a DIMM from a conductive path to a memory controller and couple a substitute DRAM to the conductive paths in its place.

19 Claims, 9 Drawing Sheets

(56) References Cited

U.S. PATENT DOCUMENTS

| | | | |
|---|---|---|---|
| 7,898,228 B1* | 3/2011 | Shin | H03K 17/04163 323/222 |
| 9,009,383 B2* | 4/2015 | Hendry | G06F 1/3203 711/100 |
| 2004/0168101 A1* | 8/2004 | Kubo | G06F 11/108 714/6.12 |
| 2004/0216011 A1 | 10/2004 | Co et al. | |
| 2005/0114750 A1* | 5/2005 | Deegan | G06F 11/1016 714/763 |
| 2007/0015381 A1* | 1/2007 | Muff | G11C 5/04 439/74 |
| 2008/0010435 A1 | 1/2008 | Smith et al. | |
| 2008/0094811 A1* | 4/2008 | Hazelzet | G11C 5/04 361/760 |
| 2008/0180899 A1 | 7/2008 | Pearson et al. | |
| 2008/0266993 A1 | 10/2008 | Goldsteln et al. | |
| 2010/0003837 A1* | 1/2010 | Loughner | G11C 5/04 439/64 |
| 2010/0106904 A1* | 4/2010 | Berke | G06F 11/1441 711/114 |
| 2010/0162020 A1* | 6/2010 | Maule | G11C 5/04 713/324 |
| 2012/0262875 A1* | 10/2012 | Johnson | G06F 1/32 361/679.33 |
| 2013/0107443 A1 | 5/2013 | Kim et al. | |
| 2013/0151745 A1* | 6/2013 | Yin | G06F 1/189 710/301 |
| 2014/0181435 A1* | 6/2014 | Privitt | G06F 11/2097 711/162 |

* cited by examiner

DUAL IN LINE MEMORY MODULE (DIMM) CONNECTOR

BACKGROUND

Field

The present disclosure generally relates to memory design and fabrication. More specifically, one aspect of the present disclosure relates to an enhanced dual in line memory module (DIMM) connector.

Background

Electronic devices, such as computers and cellular telephones, are generally constructed from a large number of electronic components mounted on one or more densely populated circuit boards. The performance characteristics and functionality of electronic devices may be limited by circuit board surface area constraints. Adding new features or functionalities to an electronic device to be constructed from components of a particular scale generally involves increasing the surface area of one or more circuit boards in the device or removing other features and functionalities from the device.

Personal computers, workstations, servers and many other general purpose computers and special purpose computers are commonly constructed using a base circuit board, often referred to as a motherboard or backplane, coupled to a number of separate circuit boards, often referred to as, modules or expansion cards. A motherboard generally includes a number of industry standard connectors mounted on its surface and a number of conductive paths coupled to the standard connectors. Modules or expansion cards generally include a set of exposed conductive contacts along an edge portion, which are electrically coupled to respective conductive paths in and arranged for mating with the industry standard connectors.

SUMMARY

A memory module connector includes a connector body configured to mechanically retain an industry standard memory module to a circuit board and a first set of electrical paths extending through the connector body. The first set of electrical paths is configured to electrically couple the industry standard memory module to the circuit board. The memory module connector also includes a second set of electrical paths configured for coupling the first set of electrical paths to logic circuitry on the connector body.

A system includes a memory controller, a connector supporting an industry standard memory module(s). The connector includes logic operable to access and route pin outs of primary and secondary memory devices. The system also includes a redundancy controller coupled to the connector. The redundancy controller is operable to direct the connector to activate and remap the secondary memory devices to replace a failing primary memory device in response to a request from the memory controller.

A method for controlling a memory module connector includes electrically coupling an industry standard memory module to a memory controller circuit on a circuit board via a set of electrical paths extending through a connector body. The connector body is configured to mechanically retain the industry standard memory module to the circuit board. The method also includes coupling the first set of electrical paths to logic circuitry on the connector body. The logic circuitry is configured for accessing signaling to and from the industry standard memory module.

A memory module connector includes means for mechanically retaining an industry standard memory module to a circuit board. The memory module connector according to this aspect also includes a first set of electrical paths extending through the mechanically retaining means. The first set of electrical paths are configured to electrically couple the industry standard memory module to the circuit board. The memory module connector also includes a second set of electrical paths configured for coupling the first set of electrical paths to logic circuitry on the mechanically retaining means.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

According to aspects of the present disclosure, interposer circuitry is configured on the surface of a dual in-line memory module (DIMM) connector or embedded within the body of a DIMM connector. The interposer circuitry is coupled to conductive paths in the DIMM connector to access any signaling to and/or from a DIMM installed in the connector. The disclosed DIMM connector may conform to industry standard conductor arrangements and physical dimensions for coupling to standard DIMMs. Incorporating the interposer circuitry on the DIMM connector or within the DIMM connector body according to aspects of the present disclosure allows additional capability to be included on a computing device without increasing the physical size of the computing device. The disclosed signal interface on a DIMM connector provides a way to leverage outgoing or incoming signals, such as control signals and/or data signals to or from a DIMM, in numerous ways.

According to an aspect of the present disclosure, an enhanced DIMM connector including interposer circuitry may mitigate the effect of memory errors. As memory density continues to increase in many electronic devices and computer systems, the likelihood of memory errors such as single and multiple bit errors also increases. Various error correction techniques have been devised for identifying and correcting errors in electronic devices and computers. Certain previously known error correction techniques, which are widely used in server designs and other computer devices, involve the use of special DIMMs that can provide error correction codes to a memory controller for identification and/or correct single bit memory errors.

Custom DIMMs have also been previously used to implement more complex error handling techniques. Nevertheless, the use of custom DIMMs to provide additional error correction functionality is much more expensive than using standard DIMMs. Moreover, the use of custom DIMMs in a system design can add cost by constraining the DIMM system architecture and/or tying the system design to a single DIMM vendor, for example. An enhanced DIMM connector including connector mounted control circuitry, according to an aspect of the present disclosure, facilitates the implementation of error protection schemes that can reduce the detrimental effects of single bit errors and multiple bit errors in a computing device without adding substantial cost, and consuming additional space within the computing device.

Figure 1A:
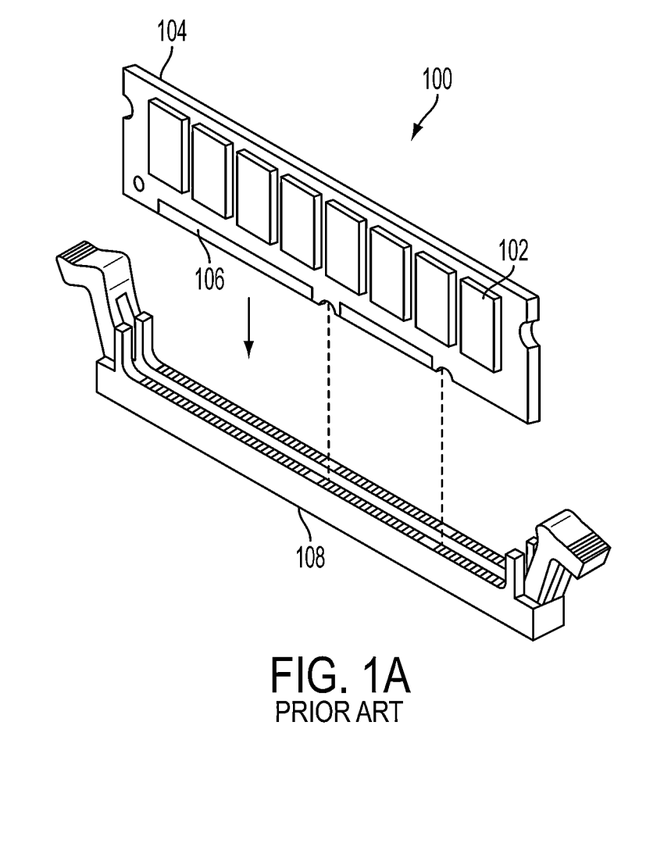
FIG. 1A is an illustration of a conventional, industry standard dual in-line memory module (DIMM) and a DIMM connector.
Figure 1B:
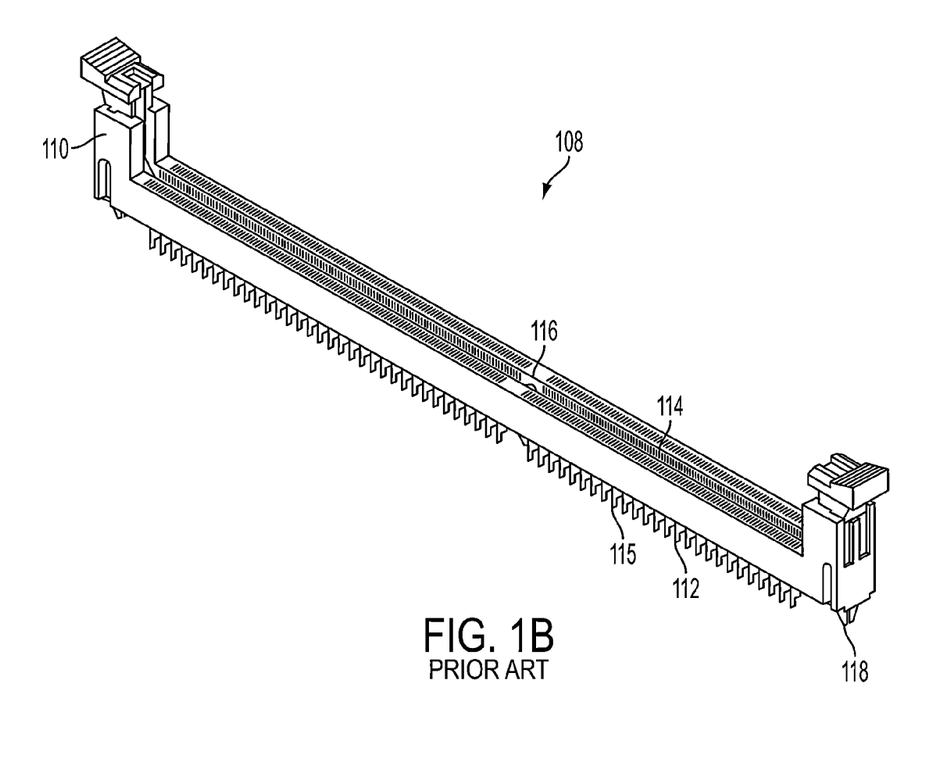
FIG. 1B is an illustration of a conventional, industry standard DIMM connector.
Figure 2:
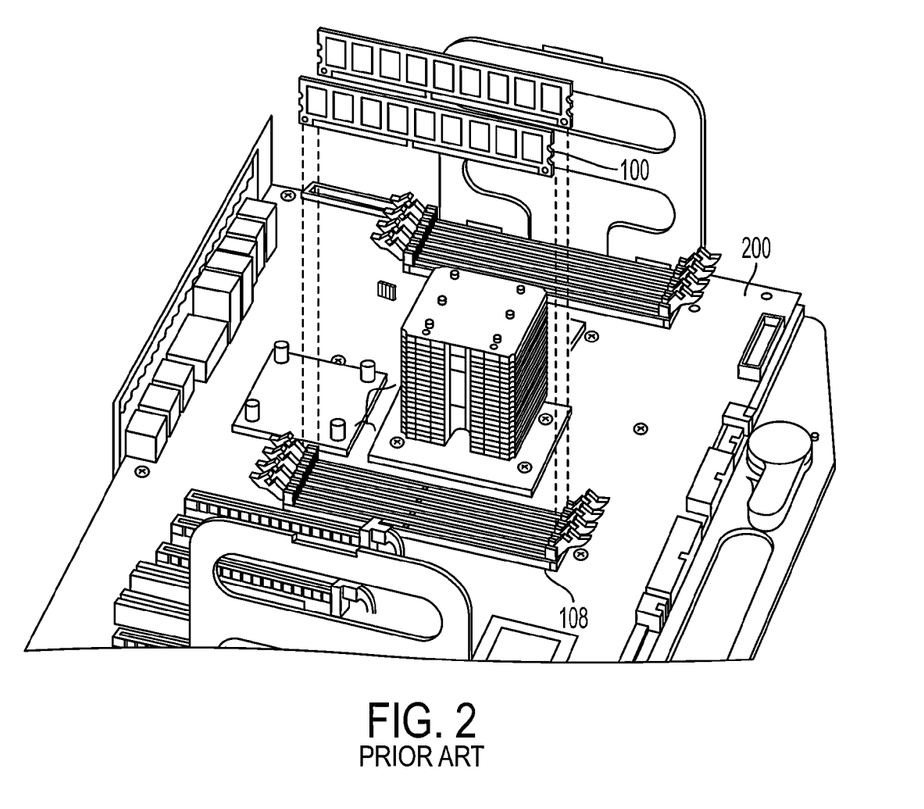
FIG. 2 is an illustration of a conventional, industry standard DIMM and a DIMM connector on a base printed circuit board.

FIGS. 1A-1B and FIG. 2 show a dual in-line memory module (DIMM) 100, which is an industry standard type of module, which generally includes a series of dynamic random-access memory (DRAM) integrated circuits 102 mounted on a printed circuit board (PCB) 104. Electrical contacts 106 coupled to the integrated circuits 102 by conductive paths on the PCB 104 are spaced in a standard arrangement along an edge of the DIMM 100 for mating with respective conductive terminals of a DIMM connector 108. The electrical contacts 106 are commonly located on both sides of the PCB 104 for mating with two separate rows of conductive terminals in the DIMM connector 108.

DIMM connectors 108 are industry standard connectors configured for removable coupling of the DIMMs 100 to a base printed circuit board (PCB) such as a motherboard. As shown in FIG. 1B, a DIMM connector 108 includes a connector body 110 and a number of conductive terminals 112 that extend through the connector body 110. Each of the conductive terminals 112 generally includes a mating portion 114 and a solder portion 115. The mating portions are arranged inside a slot 116 of the connector body 110 to contact a corresponding electrical contact 106 of a DIMM 100. Industry standard DIMM connectors may include separate sets of contacts arranged on each side of the slot 116 for providing an electrical interface between corresponding contacts on two sides of a DIMM 100.

As shown in FIG. 1B and FIG. 2, a DIMM connector 108 is generally permanently coupled to a base PCB, such as a motherboard 200, by soldering the solder portion 115 of each of the conductive terminals 112 of the DIMM connector 108 to the conductive paths of the motherboard 200. DIMM connectors 108 may also be coupled to a motherboard 200 by mechanical means such as snap arms 118 or mechanical fasteners. This mechanical attachment securely locates the DIMM connector 108 on a surface of the motherboard 200 and relieves strain from solder joints that couple the solder portions 115 of the conductive terminals 112 to conductive paths of the motherboard 200.

Figure 3A:
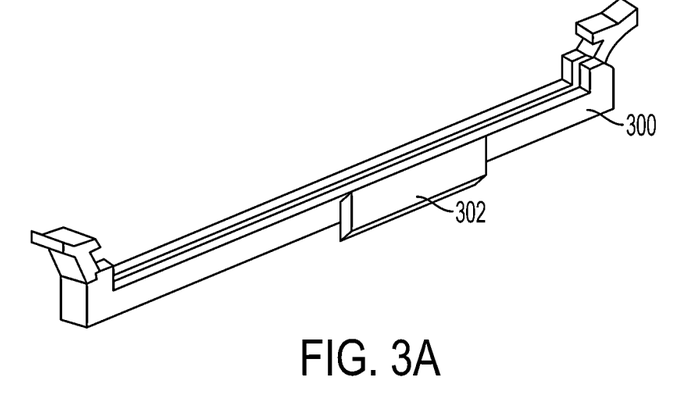
FIGS. 3A and 3B are illustrations of an enhanced DIMM connector including interposer circuitry according to an aspect of the present disclosure.
Figure 3B:
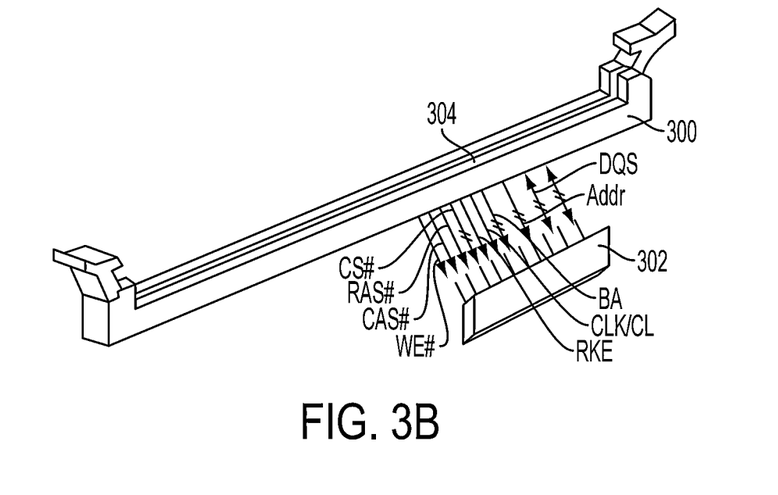

Referring to FIGS. 3A and 3B, one aspect of the present disclosure includes an enhanced DIMM connector 300 configured to provide supplemental contacts between a custom integrated circuit (IC), referred to herein as interposer circuitry 302, and standard contacts of the enhanced DIMM connector 300. The connector mounted on the interposer circuitry 302 may include logic circuitry, such as control circuitry and/or one or more secondary dynamic random access memory (DRAM) arrays, for example. In one example, a set of supplemental contacts allows the interposer circuitry 302 to send and/or receive signals to and/or from DIMMs that are mounted in the enhanced DIMM connector 300.

According to an aspect of the present disclosure, the enhanced DIMM connector 300 provides access to some or all of the signaling between a base PCB such as a motherboard or backplane and memory on a DIMM. By locating the interposer circuitry 302 on the body 304 of an enhanced DIMM connector 300, no additional space on the base PCB or on the DIMM is consumed by the control circuitry.

Figure 4:
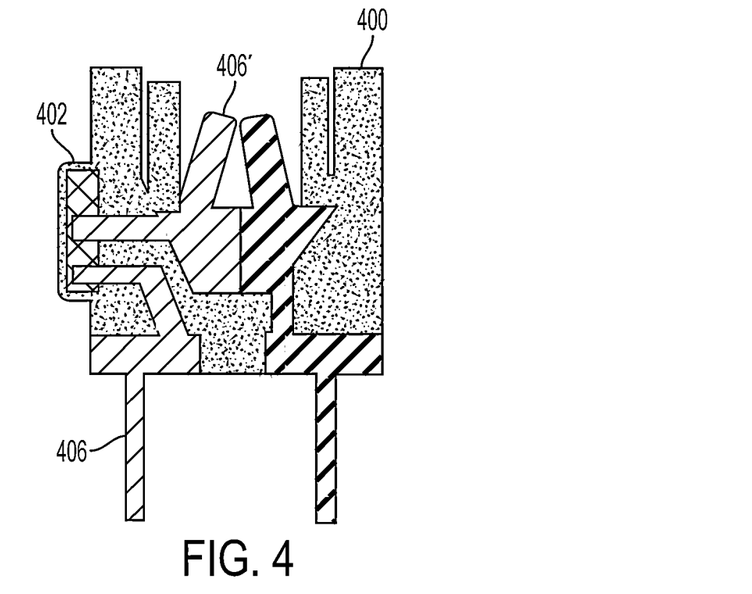
FIG. 4 is a cross-sectional side view of an enhanced DIMM connector including interposer circuitry coupled in series with standard conductive paths according to aspects of the present disclosure.

FIG. 4 is a cross-sectional side view illustration of an enhanced DIMM connector 400 according to an aspect of the present disclosure in which the interposer circuitry 402 is coupled in series with conductive paths 406, 406' extending through the connector. The conductive path 406, 406' provides coupling between a base PCB and a DIMM installed in the enhanced DIMM connector 400. For example, the conductive path 406, 406' may be arranged in an industry standard arrangement. Coupling of the interposer circuitry 402 in series with the conductive paths 406, 406' allows the interposer circuitry 402 to actively access signals to and/or from the DIMM, such as data (DQ) and data strobe (DQS), for example.

Figure 5:
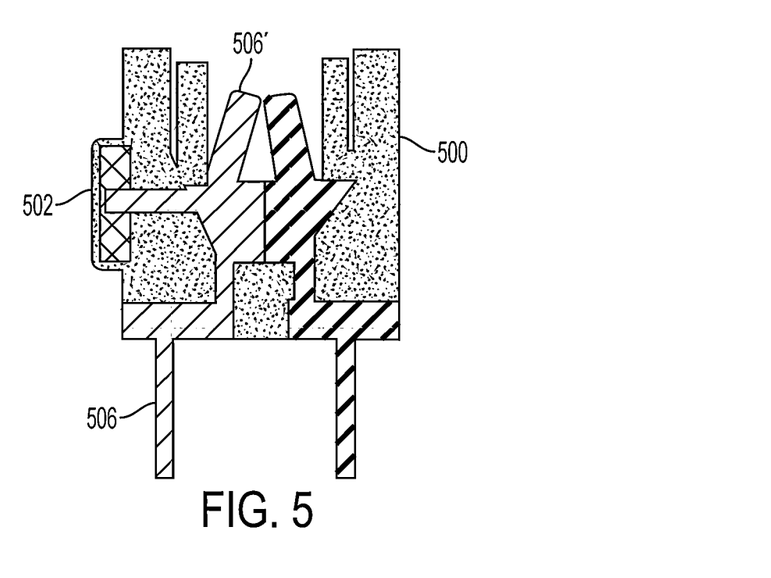
FIG. 5 is a cross-sectional side view of an enhanced DIMM connector including interposer circuitry coupled in parallel with standard conductive paths according to aspects of the present disclosure.

FIG. 5 is a cross-sectional side view illustration of an enhanced DIMM connector 500 according to an aspect of the present disclosure in which the interposer circuitry 502 is coupled in parallel with conductive paths 506, 506' extending through the connector. The conductive path 506, 506' provide coupling between a base PCB and a DIMM installed in the enhanced DIMM connector 500 and may be arranged in an industry standard arrangement, for example. Coupling of the interposer circuitry 502 in parallel with the conductive paths 506, 506' allows the interposer circuitry 502 to passively access signals to and/or from the DIMM, such as command and address signals, for example.

According to another aspect of the present disclosure, an enhanced DIMM connector may include one or more conductive paths 406, 406' coupled in series with interposer circuitry as shown in FIG. 4 and one or more conductive paths 506, 506' coupled in parallel with the interposer circuitry as shown in FIG. 5.

The interposer circuitry on an enhanced DIMM connector according to aspects of the present disclosure may include logic circuitry operable to access and route signals to and/or from memory circuitry of a DIMM that is inserted in the connector. In an example implementation, the logic is operable to access and route conductive paths between primary and secondary memory devices to provide error correction functionality and/or redundancy. The primary memory device and/or the secondary memory device may be located on the DIMM that is installed in the connector. Alternatively, according to an aspect of the present disclosure, the secondary memory device may be incorporated in the interposer circuitry, for example.

In one example implementation of the disclosed DIMM connector, interposer circuitry to implement an error correction scheme includes control circuitry in an integrated circuit (IC) mounted directly to the body of the disclosed DIMM connector. This example of using connector mounted control circuitry to provide error protection can reduce the detrimental effects of single bit errors and multiple bit errors in a computing device without consuming additional space within the computing device.

In another example implementation of the disclosed DIMM connector, the interposer circuitry is configured to add spare dynamic random access memory (DRAM) circuitry to a memory system. The spare DRAM circuitry may be actively substituted for a defective DRAM on the DIMM, for example. This dynamic substitution of DRAM mitigates the effects of single bit errors and multiple bit errors on a DIMM without relying on a custom DIMM solution or increasing the physical size of a computing device.

Figure 6:
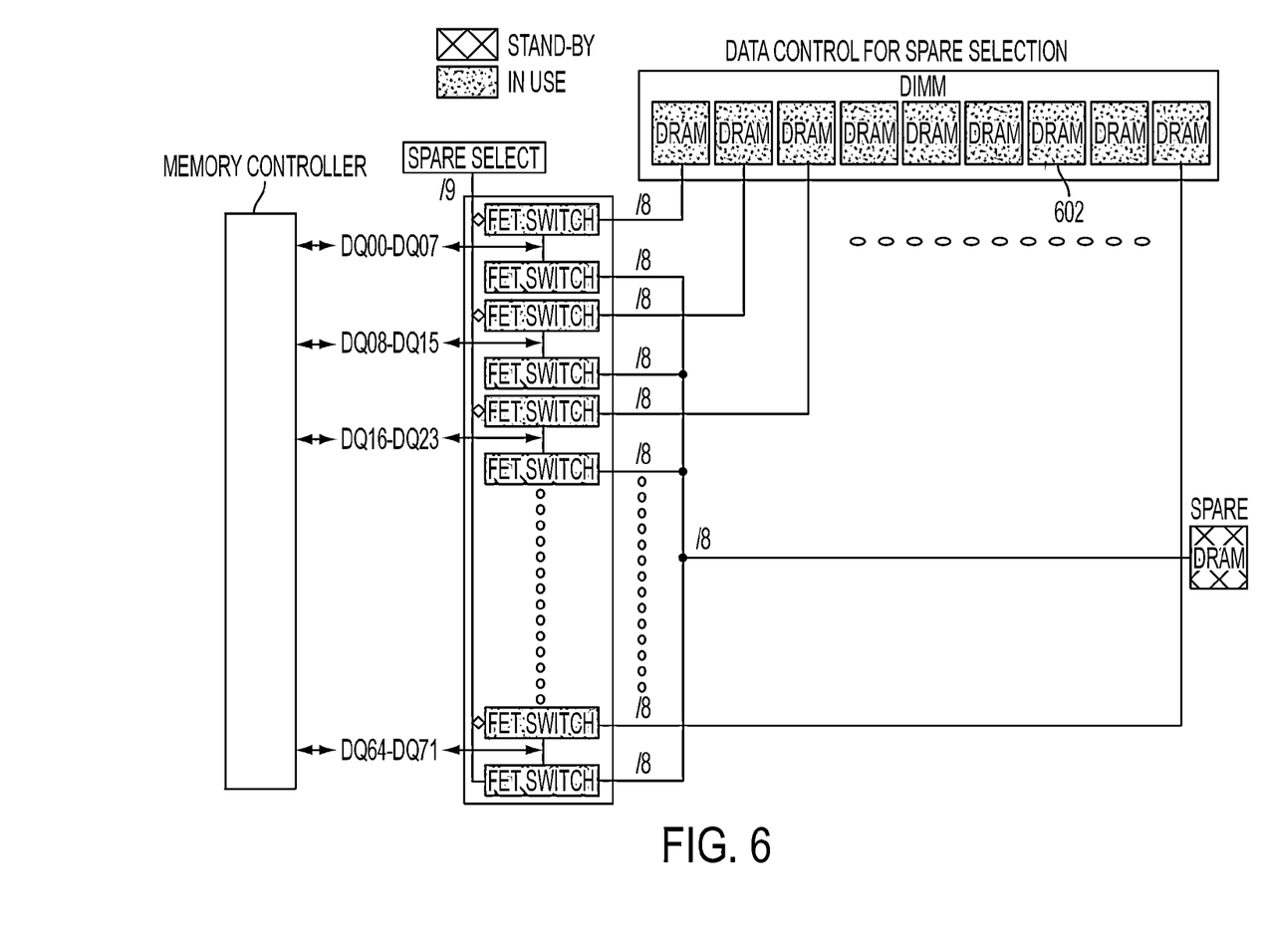
FIG. 6 is schematic diagram of a DIMM coupled to an enhanced DIMM connector including field effect transistor (FET) switches configured to implement a spare DRAM scheme according to aspects of the present disclosure.

An example of a DRAM substitution scheme that may be implemented using an enhanced DIMM connector, according to an aspect of the present disclosure, is described with reference to FIG. 6. In this example, a standard DIMM 600 including a number of DRAM chips 602 is installed in an enhanced DIMM connector 604. The enhanced DIMM connector 604 is coupled to memory controller circuitry 606, which may be mounted on a printed circuit board such as a motherboard or backplane, for example. Interposer circuitry includes a number of field effect transistor (FET) switches and is mounted or incorporated within the enhanced DIMM connector 604. A first subset of the FET switches 608 is coupled in series with conductive paths coupling each DRAM chip 602 on the standard DIMM 600 with the memory controller circuitry 606. A second subset of the FET switches 609 is coupled in series with conductive paths coupling one or more spare DRAMs 610 to the memory controller circuitry 606. Each FET switch 608 in the first subset has a corresponding FET switch 609 in the second subset.

According to an aspect of the present disclosure, spare select circuitry 612 is coupled to an enable input on each of the FET switches 608, 609. The spare select logic circuitry is configured to generate a spare select signal, which turns off one of the FET switches 608 in the first subset to decouple a defective DRAM chip 602 from the memory controller circuitry 606 and, at the same time, turns on the corresponding FET switch 609 in the second subset to couple a spare DRAM chip 610 to the memory controller circuitry 606. In one implementation, the spare DRAM chip 610 may be mounted on, or incorporated in, the enhanced DIMM connector, for example. In another implementation, the spare DRAM chip may be mounted on the printed circuit board or on another DIMM that is separately coupled to the memory controller, for example.

In one example, a connector mounted control circuit may include a redundancy controller that delivers a subset of the DRAM signals external to the connector in order to utilize secondary DRAMs. The redundancy controller may deliver a subset of the DRAM signals to a secondary DRAM located within an enhanced DIMM connector. In one example, the redundancy controller includes persistent storage for keeping track of which secondary DRAMs are in use.

According to an aspect of the present disclosure, logic circuitry is configured to access and/or reroute signaling through an enhanced DIMM connector. The signal paths being accessed may be hardwired to a specific predetermined set of contacts in the enhanced DIMM connector and/or routed through a number of FET switches controlled by the logic circuitry on the enhanced DIMM connector, for example. The disclosed DIMM connector may be scaled up to receive multiple spare DRAMs on a single enhanced DIMM connector. Additional industry standard DIMM connectors and/or enhanced DIMM connectors may be included in a memory system for coupling spare DRAMs to a printed circuit board, such as a motherboard or backplane.

According to an aspect of the present disclosure, a memory system may be configured to include industry standard DIMMs and the disclosed enhanced DIMM connectors. Each of the industry standard DIMMs may be seated in a respective one of the presently disclosed enhanced DIMM connectors. In another example, each of a subset of the industry standard DIMMs may be seated in a respective one of the presently disclosed enhanced DIMM connectors, while the remainder may be seated in industry standard connectors. In some memory implementations, according to an aspect of the present disclosure, a memory system may include modules seated on a single one of the disclosed enhanced DIMM connectors, for example.

Figure 7:
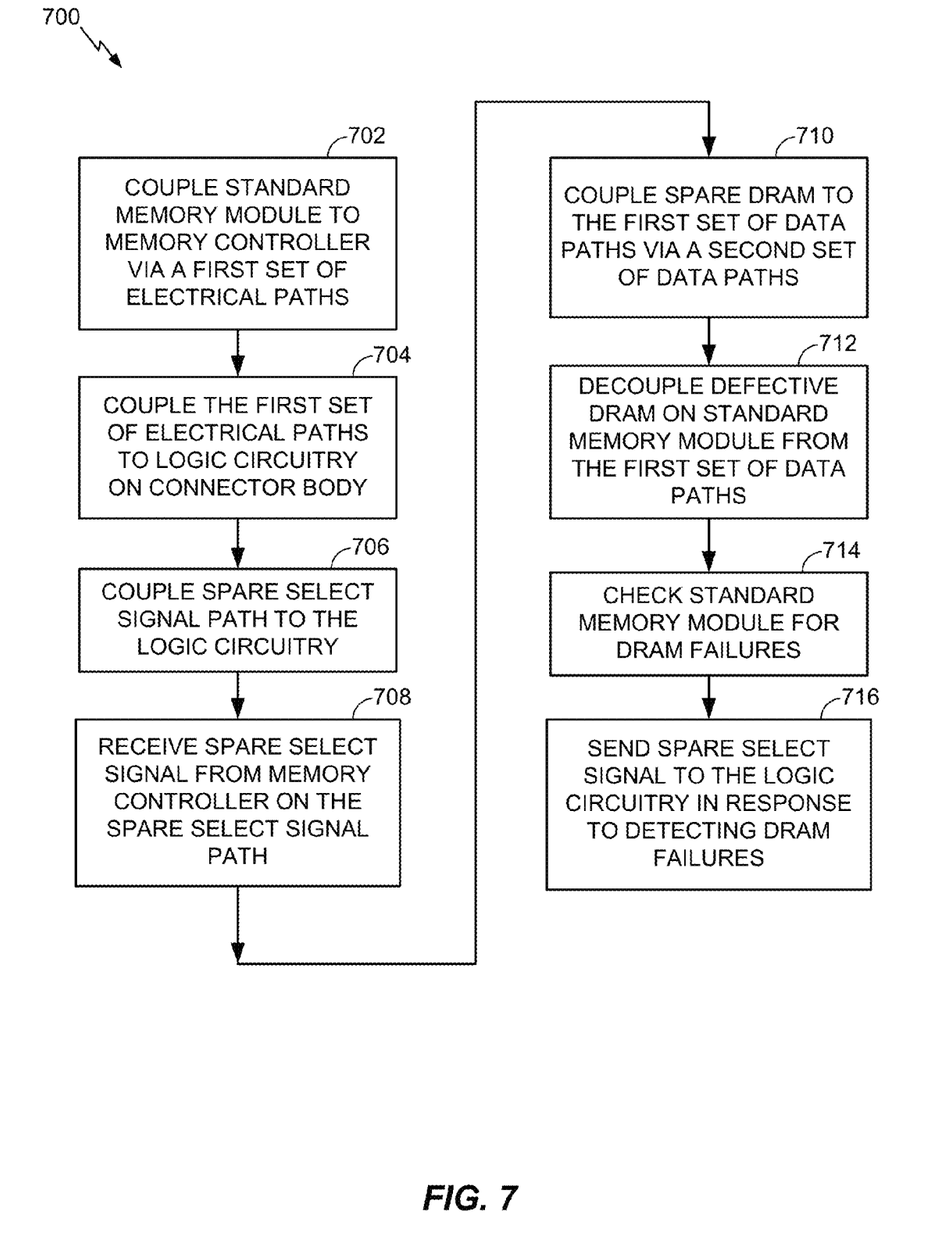
FIG. 7 is a process flow diagram illustrating a method for controlling a memory module according to aspects of the present disclosure.

A method for controlling a memory module according to an aspect of the present disclosure is described with reference to FIG. 7. The method 700 includes electrically coupling an industry standard memory module to a memory controller circuit on a circuit board first via a set of electrical paths at block 702. The first set of electrical paths extends through a connector body configured to mechanically retain an industry standard memory module to the circuit board. At block 704, the method 700 also includes coupling the first set of electrical paths to logic circuitry on the connector body. The logic circuitry is configured for accessing signaling to and from the industry standard memory module, for example.

According to an aspect of the disclosure, the method 700 may include coupling a spare select signal path to the logic circuitry at block 706, and receiving a spare select signal from a memory controller on the spare select signal path at block 708. The method also includes coupling a spare DRAM to the first set of data paths via a second set of data paths extending through the connector body in response to receiving the spare select signal at block 710. At block 712, the method 700 includes decoupling a defective DRAM on the industry standard memory module from the first set of data paths in response to receiving the spare select signal.

According to an aspect of the present disclosure the method 700 may also include checking the standard memory module for dynamic random access memory (DRAM) failures at block 714 and sending the spare select signal to the logic circuitry in response to detecting a failure of the DRAM at block 716.

In one aspect of the present disclosure, a memory module connector includes means for mechanically retaining an industry standard memory module to a circuit board. The memory module connector also includes a first set of electrical paths extending through the mechanically retaining means. In one aspect, the mechanically retaining means is the connector body 110. In another aspect, the aforementioned means may be any structure configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Figure 8:
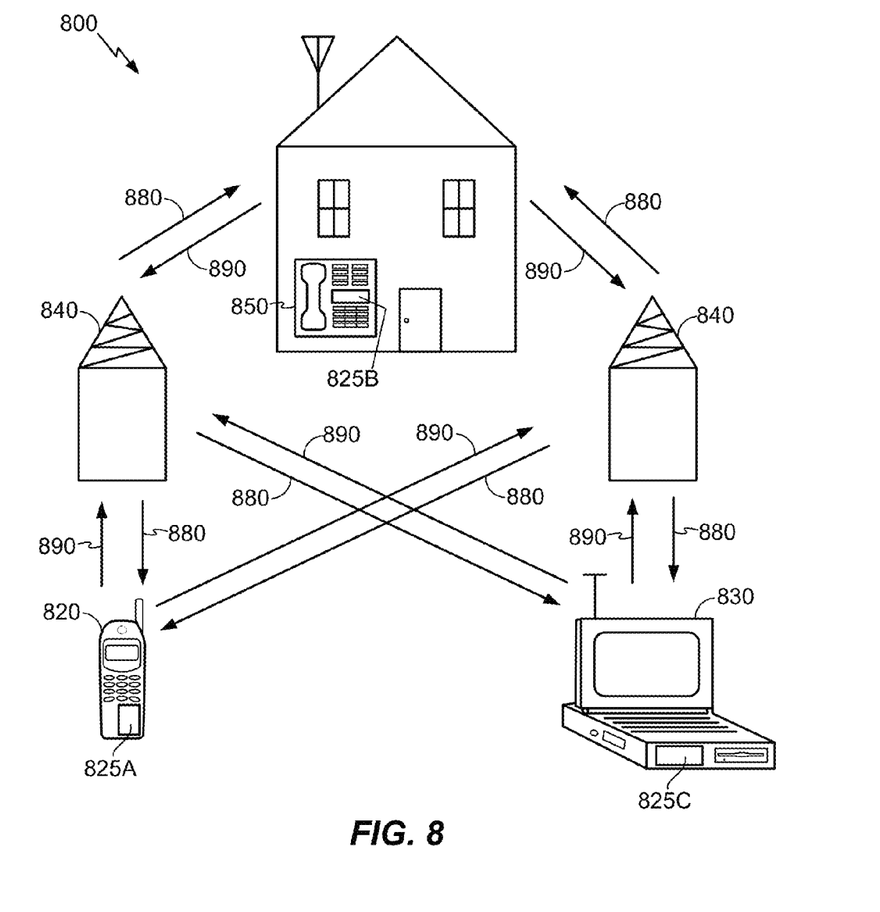
FIG. 8 is a block diagram showing an exemplary wireless communication system in which a configuration of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C and 825B that include the disclosed enhanced DIMM connector apparatus. It will be recognized that other devices may also include the disclosed enhanced DIMM connector apparatus, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 8 illustrates remote units according to the teachings of the disclosure, the disclosure is not limited to these exemplary illustrated units. Aspects of the disclosure may be suitably employed in many devices, which include an enhanced DIMM connector apparatus.

Figure 9:
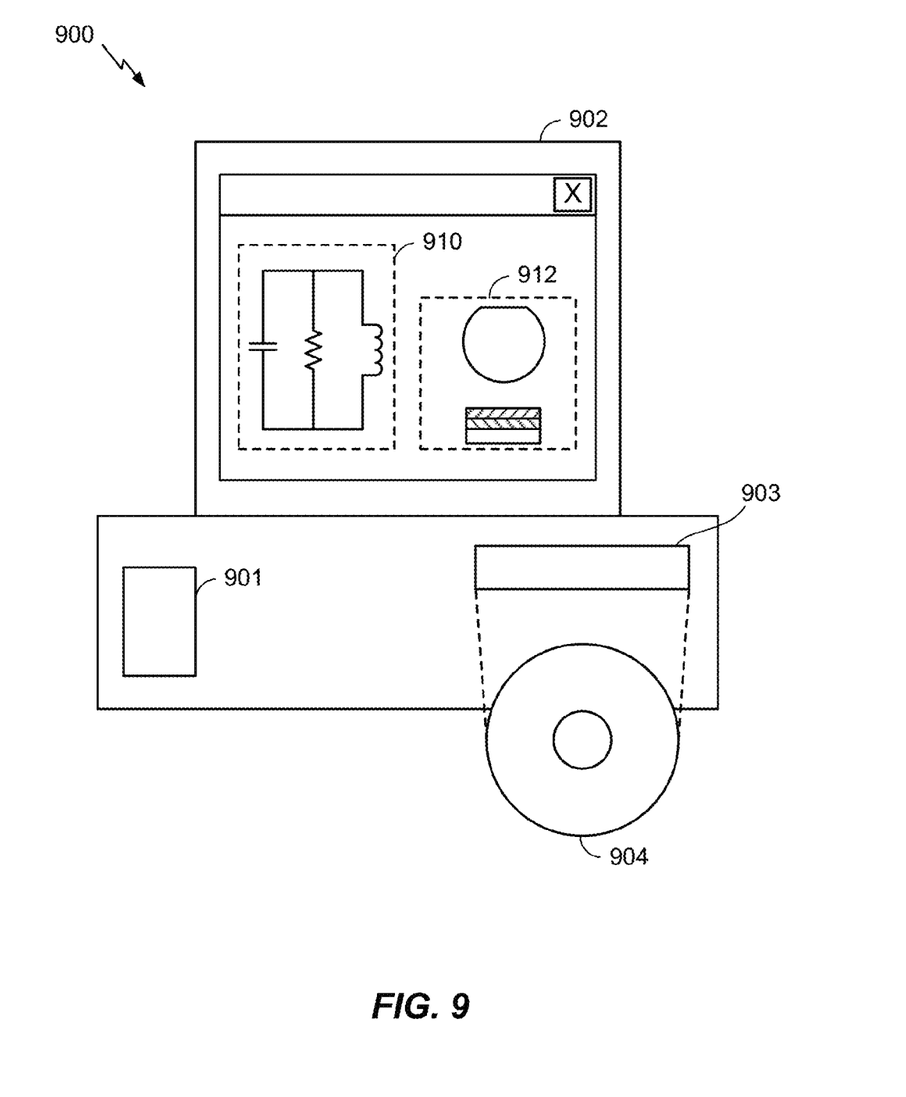
FIG. 9 is a block diagram illustrating a design workstation used for circuit, layout, and logic design of a memory system component according to one configuration.

FIG. 9 is a block diagram illustrating a design workstation used for circuit, layout, and logic design of a memory system component, such as the enhanced DIMM connector apparatus disclosed above. A design workstation 900 includes a hard disk 901 containing operating system software, support files, and design software such as Cadence or OrCAD. The design workstation 900 also includes a display 902 to facilitate design of a circuit 910 or a semiconductor component 912 such as an enhanced DIMM connector apparatus. A storage medium 904 is provided for tangibly storing the circuit design 910 or the semiconductor component 912. The circuit design 910 or the semiconductor component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may include specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit design 910 or the semiconductor component 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

It should be appreciated that memory devices including the enhanced DIMM connectors described herein may be included within a personal computer, GPS enabled devices, navigation devices, set top boxes, music players, video players, entertainment units, fixed location data units such as meter reading equipment, or any other device that stores or retrieves data or computer instructions, or any combination thereof. Accordingly, aspects of the disclosure may be suitably employed in any device, which includes active integrated circuitry including memory having magnetic tunnel junction (MTJ) storage elements as disclosed herein.

Further, it should be appreciated that various memory systems and devices can include an array of enhanced DIMM connectors as disclosed herein. Additionally, the enhanced DIMM connectors disclosed herein may be used in various other applications, such as network server applications, for example. Accordingly, although portions of the foregoing disclosure discuss the stand alone enhanced DIMM connector, it will be appreciated that various aspects can include devices into which the enhanced DIMM connector is incorporated.

Accordingly, aspects can include machine-readable media or computer-readable media embodying instructions which when executed by a processor transform the processor and any other cooperating elements into a machine for performing the functionalities described herein as provided for by the instructions.

While the foregoing disclosure shows illustrative aspects, it should be noted that various changes and modifications could be made herein without departing from the scope of the disclosure as defined by the appended claims. The functions, steps and/or actions of the method claims in accordance with the aspects described herein need not be performed in any particular order. Furthermore, although elements of the aspects may be described or claimed in the singular, the plural is contemplated unless limitation to the singular is explicitly stated.

Although the present disclosure and its advantages have been described in detail, it should be understood that various changes, substitutions and alterations can be made herein without departing from the technology of the disclosure as defined by the appended claims. For example, relational terms, such as "above," "below," "top" and "bottom" are used with respect to a substrate or electronic device. Of course, if the substrate or electronic device is inverted, above becomes below, top becomes bottom and vice versa. Additionally, if oriented sideways, the terms "above," "below," "top" and "bottom" may refer to sides of a substrate or electronic device, for example.

The word "exemplary" is used herein to mean "serving as an example, instance, or illustration." Any aspect described herein as "exemplary" is not necessarily to be construed as preferred or advantageous over other aspects. Likewise, the term "aspects of the disclosure" does not require that all aspects of the disclosure include the discussed feature, advantage or mode of operation. The terminology used herein is for the purpose of describing particular aspects only and is not intended to be limiting of aspects of the disclosure.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A memory module connector, comprising:
   a connector body configured to mechanically retain an industry standard memory module, the connector body directly coupled to a base printed circuit board;
   a first set of electrical paths extending through the connector body and configured to electrically couple the industry standard memory module to the base printed circuit board;
   a second set of electrical paths configured for coupling the first set of electrical paths to logic circuitry; and
   an integrated circuit including the logic circuitry, the integrated circuit mounted directly on the connector body, the logic circuitry operable to route signals on the first set of electrical paths between a primary memory device of the industry standard memory module and a secondary memory device and operable to activate and remap the secondary memory device to replace the primary memory device in response to a failure of the primary memory device.

2. The memory module of claim 1, in which the logic circuitry is configured to perform dynamic random access memory (DRAM) error detection.

3. The memory module of claim 1 integrated into a set top box, a music player, a video player, an entertainment unit, a navigation device, a computer, a portable data unit, and/or a fixed location data unit.

4. A system, comprising:
   a memory controller;
   a connector body supporting at least one industry standard memory module, the connector body directly coupled to a base printed circuit board;
   an integrated circuit including logic circuitry, the integrated circuit mounted directly on the connector body and operable to access and route pin outs of a plurality of primary and secondary memory devices; and
   a redundancy controller coupled to the connector body, the redundancy controller operable to direct the logic circuitry to activate and remap the secondary memory devices to replace a failing primary memory device in response to a request from the memory controller.

5. The system of claim 4, in which the at least one industry standard memory module comprises an industry standard dual in-line memory module (DIMM); and
   the primary and secondary memory devices comprise a dynamic random access memory (DRAM).

6. The system of claim 5, in which the redundancy controller is operable to supply a subset of DRAM signals to secondary DRAMs external to the connector body.

7. The system of claim 5, in which the redundancy controller is operable to supply a subset of DRAM signals to a secondary DRAM located within the connector body.

8. The system of claim 4, in which the redundancy controller is operable to detect dynamic random access memory (DRAM) failure using error correction codes.

9. The system of claim 4, in which the redundancy controller includes persistent storage indicating which ones of the secondary memory devices are in use.

10. The system of claim 4, in which each of the at least one industry standard memory module is seated in the connector body.

11. The system of claim 4, in which a subset of the at least one industry standard memory modules are seated in the connector body while a remainder are seated in industry standard connectors.

12. The system of claim 4, further comprising at least one field effect transistor (FET) switch coupled to the logic circuitry on the connector body and configured to access and route the pin outs.

13. The system of claim 4 integrated into a set top box, a music player, a video player, an entertainment unit, a navigation device, a computer, a portable data unit, and/or a fixed location data unit.

14. A method for controlling a memory module connector, comprising:
    electrically coupling an industry standard memory module to a memory controller circuit on a base printed circuit board via a first set of electrical data paths extending through a connector body, the connector body configured to mechanically retain the industry standard memory module, the connector body directly coupled to the base printed circuit board;
    coupling the first set of electrical data paths to logic circuitry of an integrated circuit mounted directly on the connector body, the logic circuitry configured for accessing signaling to and from the industry standard memory module;
    coupling a spare select signal path to the logic circuitry;
    receiving a spare select signal, from the memory controller circuit, on the spare select signal path;
    coupling a spare dynamic random access memory (DRAM) to the first set of electrical data paths via a second set of electrical data paths extending through the connector body in response to receiving the spare select signal; and
    decoupling a defective DRAM on the industry standard memory module from the first set of electrical data paths in response to receiving the spare select signal.

15. The method of claim 14, further comprising:
    checking the industry standard memory module for dynamic random access memory (DRAM) failures;
    sending the spare select signal to the logic circuitry in response to detecting a failure of the DRAM.

16. The method of claim 14, further comprising integrating the memory module connector into a set top box, a music player, a video player, an entertainment unit, a navigation device, a computer, a portable data unit, and/or a fixed location data unit.

17. A memory module connector, comprising:
    means for mechanically retaining an industry standard memory module, the mechanically retaining means directly coupled to a base printed circuit board;
    a first set of electrical paths extending through the mechanically retaining means and configured to electrically couple the industry standard memory module to the base printed circuit board;
    a second set of electrical paths configured for coupling the first set of electrical paths to logic circuitry;
    an integrated circuit including the logic circuitry, the integrated circuit mounted directly on the mechanically retaining means, the logic circuitry operable to route signals on the first set of electrical paths between a primary memory device of the industry standard memory module and a secondary memory device; and
    a redundancy controller coupled to the mechanically retaining means, the redundancy controller operable to direct the logic circuitry to activate and remap the secondary memory device to replace the primary memory device in response to a failure of the primary memory device.

18. The memory module of claim 17, in which the logic circuitry is configured to perform dynamic random access memory (DRAM) error detection.

19. The memory module of claim 17 integrated into a set top box, a music player, a video player, an entertainment unit, a navigation device, a computer, a portable data unit, and/or a fixed location data unit.

* * * * *